United States Patent [19]

Kadomura

[11] Patent Number: 5,230,772

[45] Date of Patent: Jul. 27, 1993

[54] DRY ETCHING METHOD

[75] Inventor: Shingo Kadomura, Kanagawa, Japan

[73] Assignee: Sony Corporation, Tokyo, Japan

[21] Appl. No.: 735,839

[22] Filed: Jul. 25, 1991

[30] Foreign Application Priority Data

Jul. 27, 1990 [JP] Japan .................................. 2-198044

[51] Int. Cl.$^5$ ................................................ B44C 1/00
[52] U.S. Cl. .................................. 156/643; 156/646;
156/659.1; 156/661.1; 156/668
[58] Field of Search ...................... 156/643, 646, 661.1,
156/668, 659.1

[56] References Cited

U.S. PATENT DOCUMENTS

| 4,855,017 | 8/1989 | Douglas | 156/643 |
| 4,992,136 | 2/1991 | Tachi et al. | 156/643 |
| 5,024,722 | 6/1991 | Cathey, Jr. | 156/643 |

FOREIGN PATENT DOCUMENTS 1-206624  8/1989  Japan .
1-215024  8/1989  Japan .
1-280316 11/1989  Japan .

OTHER PUBLICATIONS

Tsujimoto et al, "Low-Temperature Microwave Plasma Etching", *1988 Dry Process Symposium*, pp. 42–49.

Kawakami et al, "Low Temperature Etching of Photoresist", Paper 1p-L-15, *Extended Abstracts (The 36th Spring Meeting 1989) The Japan Society of Applied Physics and Related Societies*, p. 579.

*Primary Examiner*—Thi Dang
*Attorney, Agent, or Firm*—Hill, Steadman & Simpson

[57] ABSTRACT

A dry etching method for suppressing the micro-loading effects at the time of etching of the resist material layer through utilization of the competitive process of the deposition of the etching reaction product and removal by sputtering. For example, if a novolak based positive type photoresist is etched using an $NH_3$ gas with the wafer temperature being maintained at 70° C. or lower, reaction products at lower vapor pressure containing elements of C, O and N are produced in the etching region. In the broader etching region, the reaction products are deposited in a larger quantity than in the narrower region. The etching rate is lowered to the extent that the etchant is consumed for removing these deposited reaction products by sputtering. The result is the averaged etching rate in the wafer surface irrespective of the size of the etching region. Excess overetching becomes unnecessary as a result of suppression of the micro-loading effects.

4 Claims, 2 Drawing Sheets

DRY ETCHING METHOD

BACKGROUND OF THE INVENTION

1. Field of the Invention

This invention relates to a dry etching method and, more particularly, to prevention of micro-loading effects during anisotropic etching of fine patterns.

2. Description of the Related Art

Recently, in keeping with the tendency towards a finer design rule of semiconductor devices, an increasing demand is raised towards a resist pattern exhibiting a higher resolution and shape anisotropy. As a technique for producing such resist pattern, there is known a multi-resist process in which an upper resist layer which is uniformly exposed to light across the film thickness to enable a high resolution to be achieved and a lower resist layer which has superior bidding properties for the step difference of the subjacent substrate are used in combination. Recently, an eximer laser stepper capable of dealing with the 0.35 μm rule has been developed, and the multi-layer resist process is becoming an indispensable technique in the field photolithography which makes use of such light exposure system.

However, the multi-layer resist process suffers from a number of inconveniences in order for the process to be put to more extensive practical application. One of these inconveniences is the micro-loading effect which means a phenomenon in which, when a material layer to be etched is patterned to a predetermined shape, the etching rate is changed as a function of the size of the etched area. The following mechanism accounts for the phenomenon.

An $O_2$-gas is used mainly for etching a multi-layer resist film. The etching conditions include high bias and low gas pressure conditions for increasing the incident ion energy and extending the mean free path of the etchant for improving the anisotropy. However, since a large number of oxygen radicals O* making a motion in random directions exist in the gaseous phase to be incident in an excess amount into a broader region to be etched, the etching rate is increased in this region. On the contrary, in the narrower region to be etched, the etching rate is lowered because the quantity of the radicals capable of falling thereon through a narrow opening in the mask is limited. If such a difference in the etching rate is produced depending on the relative size of the etching region, it becomes necessary to perform overetching in order to remove a layer that remains to be etched in the narrower region. However, this may give rise to a damage done to the broader region or to contamination due to re-affixture of a material sputtered from the substrate to the substrate surface.

The micro-loading effect may be suppressed effectively by reducing the influences exerted by radicals. The measures taken heretofore to combat the micro-loading effect include (a) lowering the gas pressure to the level of, for example, $10^{-5}$ Torr; (b) using $N_2$ not undergoing radical reactions as an etching gas; (3) etching is carried out whilst the substrate to be etched is cooled to not higher than 0° C.

The measures (a) of lowering the gas pressure are effective to extend the mean free path of the radicals as well as to reduce the obliquely incident components.

The measures (b) of using the $N_2$ gas have been proposed by the present Applicant in our Japanese Patent KOKAI Publication Hei-1-215024 and enable etching with superior anisotropy under a low bias power as compared to the case of using the $O_2$ gas. The measures (c) of cooling the substrate are so-called low temperature etching which is again attracting attention in the field of dry etching. As reported for example in Dry Process Symposium Extracts, 1988, pages 42 to 49, the low temperature etching is a technique in which the substrate being etched is maintained at a lower temperature to discontinue the radical reaction in the sidewall section to prevent shape defects, such as side etching, while the etching rate along the depth is maintained by the ion assist effect. As an example of application of the low temperature etching to resist processing, a report is made in the Prepapers for Lectures in 36th Applied Physics Association Lectures, Spring Meeting, 1989, page 574, lecture number 1p-L-15, concerning an example of etching the lower resist layer of the three-layer resist pattern with the wafer being cooled to a temperature of −100° C. or lower.

However, the above described measures for suppressing the micro-loading effects suffers from certain demerits. That is, with (a), the quantity of the etchant itself is reduced due to lowering of the gas pressure resulting in significant decrease of the etching rate. Therefore, the measures (a) are not practically useful. With (b), since the main etchant is the low energy ions, a higher etching rate basically can not be achieved. With (c), the temperature of −100° C. or lower is required for deposition of the reaction product contributing to the realization of anisotropy. Therefore, in consideration of the necessity of providing a cooling system or a system for combatting dewing, or the time necessary for cooling, the measures (c) are not preferred from the viewpoint of economics or throughput.

OBJECT AND SUMMARY OF THE INVENTION

It is an object of the present invention to provide a dry etching method whereby the layer of a resist material may be processed to a satisfactory anisotropic shape without being affected by the micro-loading effects and without lowering the etching rate or worsening the throughput or economics.

As a result of our searches towards achieving the object, the present inventors have found that, in the dry etching of an organic film (layer of a resist material) making use of $NH_3$ as disclosed in our Japanese Patent KOKAI Hei 1-280316, the micro-loading effects may be suppressed by further controlling the temperature of the substrate being etched to optimize the amount of deposition of the reaction product.

The dry etching method according to the present invention has been proposed on the basis of the above finding. The present invention resides in a dry etching method comprising controlling the temperature of a substrate being etching to 70° C. or lower and etching a layer of a resist material formed on said substrate under the conditions of depositing a portion of a reaction product with the use of an etching gas consisting mainly of $NH_3$.

It is not wholly clear under which mechanism the layer of the resist material is etched by $NH_3$. However, as disclosed in our Japanese Patent KOKAI Hei 1-280316, higher anisotropy may be achieved even under a low bias voltage than when $O_2$ is used, while the etching reaction proceeds at a markedly higher rate than when $N_2$ is used. This is possibly ascribable to disruption of chemical bonds in the resist molecules by hydrogen radicals (H*).

By controlling the temperature of the substrate being etched to 70° C. or lower, it becomes possible to cause certain reaction compounds among a variety of reaction compounds exhibiting a lower vapor pressure to be deposited in the etching region even in the vicinity of ambient temperature. Although the precise composition of the reaction products is not known, at least the elements of C, O and N are contained in the composition.

It is noted that, when forming a fine pattern at the submicron level, the amount of the deposited reaction product is larger in the broader etching region into which may fall a larger amount of the etchant, than in the narrower etching region in which may fall only a minor amount of the etchant, not only with respect to the absolute quantity but also with respect to the quantity per unit area. Should the deposited substance exist in the etching region, the etchant is consumed for removing the deposited substance, so that the etching rate is lowered in proportion to the deposited quantity. In short, the larger an etching region in area and the more the quantity of the deposited substance, the lower is the etching rate in the region. Thus the etching rate is averaged for the substrate in its entirety to suppress the micro-loading effects.

Meanwhile, with the mechanism which makes use of the deposition of the reaction product exhibiting a low vapor pressure, the amount of the deposited substance is naturally changed as a function of the temperature of the substrate being etched. It is predicted that undercooling leads to unusual undercut profile while excess cooling leads to unusual shape such as forward taper. The range of temperature control for the substrate being etched is set to −30° to 50° C. in order to suppress these shape defects to a practically allowable range.

BRIEF DESCRIPTION OF THE DRAWINGS

FIGS. 1A and 1B are schematic cross-sectional views showing an embodiment of the present invention applied to a three-layer resist process step by step, wherein FIG. 1A shows the patterning process for patterning an upper resist layer, and FIG. 1B shows the etching process.

FIG. 3 shows an XPS spectrum showing the results of analyses of the reaction products of the dry etching method of the present invention by X-ray photoelectron spectroscopy.

DETAILED DESCRIPTION OF THE INVENTION

Figure 1A:
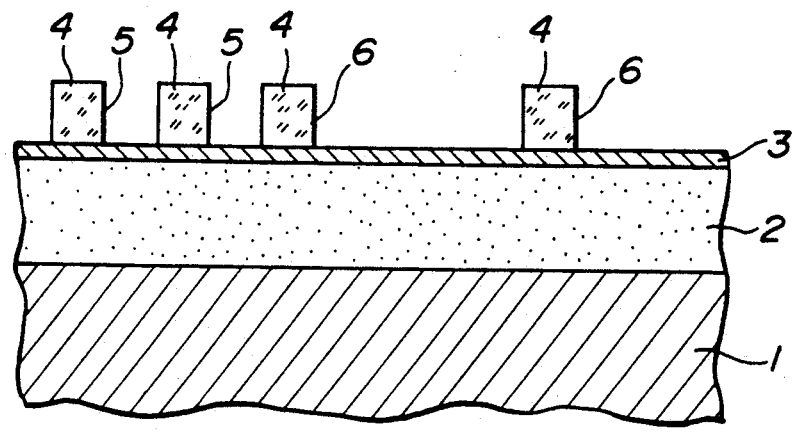

By referring to the drawings, a preferred embodiment of the present invention is explained by referring to the drawings.

In the present embodiment, the present invention is applied to a three-layer resist process.

Referring first to FIG. 1A, a novolak based positive type photoresist, manufactured and sold by Tokyo Ohka Kogyo-Sha under the trade name of OFPR 800, is coated on a substrate 1 to a thickness of approximately 1 $\mu$m to form a lower resist layer 2. On this layer 2, an intermediate layer 3 of silicon oxide is formed to a thickness of approximately 0.1 $\mu$m by spin-on-glass (SOG) coating a sputtering. On this layer 3, a novolak based positive type photoresist, manufactured and sold by Tokyo Ohka Kogyo-sha under the trade name of TSMR-V3, is coated to a thickness of approximately 0.5 $\mu$m to form an upper resist layer 4. Patterning is then effectuated in a predetermined manner by photolithography by light exposure to g-rays (436 nm) to form a wafer. By this patterning, a first opening 5 with an opening diameter of approximately 0.6 $\mu$m and a second opening 6 with an opening diameter of approximately 3 $\mu$m are formed.

Figure 1B:
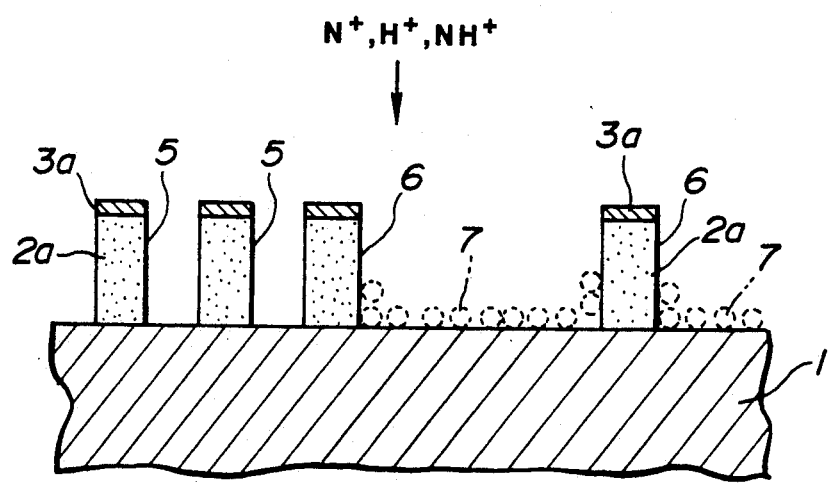

The above mentioned wafer is set in a high frequency bias impressing type electron cyclotron resonance (ECR) plasma etching apparatus, provided with a temperature control system capable of controlling the wafer temperature to not higher than 70° C. While the wafer temperature is controlled to, for example, 30° C., etching is carried out under the conditions of the $NH_3$ flow rate of 50 SCCM, gas pressure of 1.3 Pa (10 m Torr), micro-wave power of 850 W and an RF bias power of 200 W (13.56 MHz). The pattern of the upper resist layer 4 is first transferred to the intermediate layer 3 to form an intermediate layer pattern 3a. Etching of the lower resist layer 2 then proceeds with the upper resist layer 4 and the intermediate layer pattern 3a as the mask. Since the upper resist layer 4 is consumed by sputtering, a lower resist pattern 2a is ultimately formed below the intermediate layer pattern 3a, as shown in FIG. 1B.

During this etching process, etching proceeds at a practically useful rate, whilst satisfactory anisotropic shape is achieved at both the first opening 5 and the second opening 6, for the reason that the effects of the radicals are lowered due to the lower gas pressure and the high bias conditions, that a reaction product 7 having a low vapor pressure at 30° C. is deposited in the openings to display sidewall protection effects, and that ions such as $NH^+$, $N^+$ or $H^+$ take part in the etching reaction. In addition, etching depths are substantially equal at any of the openings and micro-loading effects are not displayed.

The reason therefore may be analyzed in the following manner. The deposited amount of the reaction product 7 in the second opening 6 with a wider etching area is larger than that in the first etching area 5 with a narrower etching area both in term of the absolute amount and in terms of the amount per unit area. The deposited reaction product 7 not only achieves side wall protection of the openings 5 and 6 to contribute to improved anisotropy but also lowers the etching rate effectively at, above all, the second opening 6 due to the combined action of the heaping reaction and the removal by sputtering. Therefore, the etching rate becomes the lower, the broader the etching area of a given site, and approaches the etching rate at a narrower site. As a result, the distribution of the etching rate in a wafer surface is lowered to suppress the micro-loading effect.

Then, for investigating into the temperature dependency of the shape anisotropy, the undercut ratios were measured in relation to changes in the waver temperature in the range of −30° to 120° C. The conditions other than the wafer temperature were the $NH_3$ flow rate of 50 SCCM, the gas pressure of 1.3 Pa (10 m Torr), the microwave power of 850 W and the RF bias power of 50 W (13.56 Mhz). The undercut ratio is defined as the retrogression a of the edge of the lower resist pattern from the edge of the intermediate pattern 3a divided by the etching depth b and multiplied by 100 for expression in terms of a percentage (a×100/b).

Figure 2:
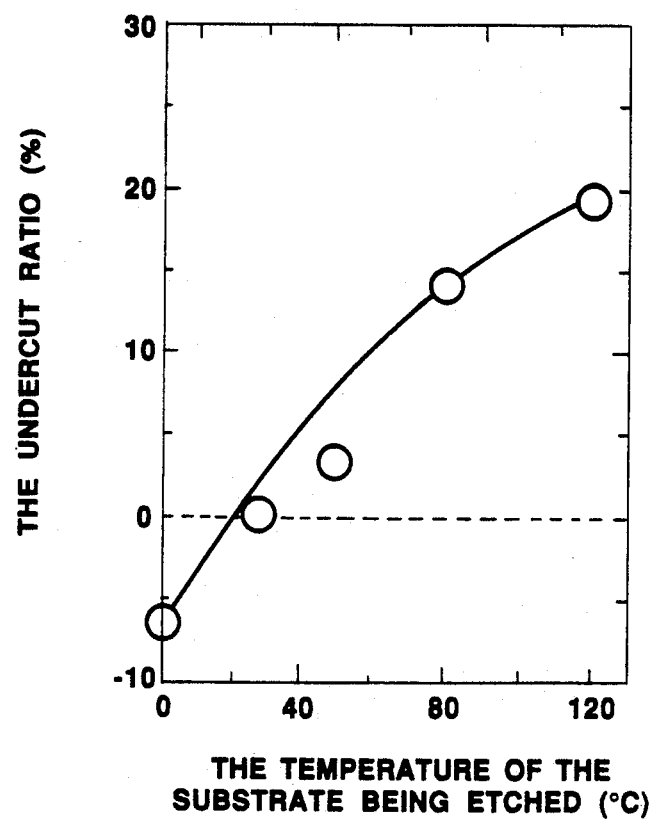
FIG. 2 is a graph showing the temperature dependency of the undercut ratio in the dry etching method of the present invention.

The results are shown in FIG. 2 where the ordinate stands for the undercut ratio in percentage (%) and the abscissa the wafer temperature (°C.). It is when above all the temperature control is not made that the wafer temperature reaches 120° C. It is seen from this figure that substantially complete anisotropy is attained under the above mentioned conditions for the wafer temperature of 50° C. Undercuts were produced at the temperatures higher than 50° C.

On the contrary, the undercut ratio were of negative values at the temperatures lower than 50° C. This means that the pattern width of the lower layer resist pattern 2a becomes larger than the pattern width of the intermediate layer pattern 3a, functioning as the mask, so that forwardly tapered lower layer resist pattern is produced. Besides, the taper angle of the lower layer resist pattern becomes larger in the region of a broader opening diameter, thus indicating that the reaction product was deposited in an amount in excess of the amount removed by sputtering.

Thus, in etching the layer of the resist material by $NH_3$, it is evident that, by optimizing the etching conditions as a function of the opening diameter, anisotropic etching becomes possible with simultaneous suppression of the micro-loading effects. If the allowable limit of the undercut ratio is about +10%, satisfactory results may be obtained for the region of the wafer temperature not higher than 70° C. This is the reason of setting of the upper limit of the temperature in the first subject-matter of the present invention. More preferably, the wafer temperature is set to −30° to 50° C., as defined in accordance with the second subject-matter of the present invention. In this manner, at least the undercuts are less likely to occur, while the increase in the pattern width due to the forward taper may be easily controlled to be within the practically allowable range.

The results of our analyses of the composition of the reaction product of the above described etching reaction will be hereinafter explained.

FIG. 3 shows $C_{1S}$ signals obtained by the XPS analyses of the reaction product. In this figure, the ordinate stands for the signal intensity in arbitrary units, the abscissa stands for the binding energy (eV), and curves, I, II and III stand for the signal intensity related to the binding energy at the wafer temperatures of −30° C., 50° C., respectively. It is seen from this figure the peak value for the C—O and C=O bonds in the vicinity of 286 eV becomes more pronounced for the lower temperature.

Table 1 shows results of the peak separation and calculation of the proportions of the respective bonds on the basis of the values shown in FIG. 3.

TABLE 1

| temperature of the etched substrate | amount of the bonds | | |
|---|---|---|---|
| | C—C bond (%) | C—O bond (%) | C=O bond (%) |
| −30° C. | 60.2 | 29.1 | 10.8 |
| 50° C. | 62.8 | 29.7 | 7.5 |
| 120° C. | 72.6 | 21.1 | 6.3 |

It is seen from Table 1 that the lower the wafer temperature, the larger the amounts of the C—O and C=O bonds. Similar analyses of the $N_{1S}$ signals indicate that the amount of the N—H bond increases in the direction of the decreasing temperature. It may be surmised from these results that the reaction product of the dry etching process of the present invention is composed mainly of a substance produced by a reaction of a decomposition product of $NH_3$ with a fragment containing C—O and C=O bonds of the molecular structure of the photoresist material. However, details of the structure will become apparent only by future studies and investigations.

The present invention is not limited to the foregoing embodiments. For example, such gases as $O_2$ $H_2$ or Ar may occasionally be added to the above described etching gases.

What is claimed is:

1. A dry etching method comprising the steps of providing a substrate having a layer of resist material thereon, controlling the temperature of the substrate to be not higher than 70° C. and, while controlling the temperature, etching the layer of resist material with an etching gas consisting mainly of $NH_3$ to expose portions of the substrate and to deposit a reaction product, which is made by the etching gas and the resist material, to minimize micro-loading effect.

2. A dry etching method according to claim 1, wherein the step of controlling the temperature controls the temperature to be in a range of −30° C. to 50° C.

3. A dry etching method according to claim 2, wherein said reaction product has a composition containing at least the elements C, O and N.

4. The dry etching method according to claim 1 wherein said rection product contains at least elements C, O and N in the composition thereof.

* * * * *